United States Patent
Higashijima (10) Patent No.: US 8,944,081 B2
(45) Date of Patent: Feb. 3, 2015

(54) LIQUID PROCESSING APPARATUS AND LIQUID PROCESSING METHOD

(75) Inventor: Jiro Higashijima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 342 days.

(21) Appl. No.: 13/356,236

(22) Filed: Jan. 23, 2012

(65) Prior Publication Data
US 2012/0192899 A1    Aug. 2, 2012

(30) Foreign Application Priority Data

Feb. 1, 2011   (JP) .................................. 2011-019629
Nov. 30, 2011  (JP) .................................. 2011-262699

(51) Int. Cl.
| | | |
|---|---|---|
| *B08B 3/04* | (2006.01) | |
| *H01L 21/687* | (2006.01) | |
| *H01L 21/67* | (2006.01) | |

(52) U.S. Cl.
CPC .... *H01L 21/68742* (2013.01); *H01L 21/67017* (2013.01); *H01L 21/67051* (2013.01); *H01L 21/6719* (2013.01); *H01L 2/68728* (2013.01); *Y10S 134/902* (2013.01)
USPC ............ 134/104.1; 134/26; 134/33; 134/902; 134/137; 134/198; 118/52; 118/715; 118/730; 118/319; 118/326

(58) Field of Classification Search
CPC ..................... H01L 21/67051; H01L 21/6708; H01L 21/68728; B08B 3/04; G03F 7/162
USPC .......... 134/26, 33, 52, 902, 137; 118/52, 715, 118/730
See application file for complete search history.

(56) References Cited

U.S. PATENT DOCUMENTS 8,152,933 B2 *   4/2012   Nanba et al. .................... 134/33

FOREIGN PATENT DOCUMENTS

JP         2009-094525 A      4/2009

* cited by examiner

*Primary Examiner* — Michael Barr
*Assistant Examiner* — Thomas Bucci
(74) *Attorney, Agent, or Firm* — Abelman, Frayne & Schwab (57) ABSTRACT

Disclosed are a liquid processing apparatus and a liquid processing method that can prevent a substrate in a processing chamber from being contaminated due to contamination attached to a cup. The liquid processing apparatus includes: a processing chamber in which a substrate holding unit holding a substrate and a cup placed around the substrate holding unit are installed; a nozzle for supplying a processing liquid to the substrate held by the substrate holding unit; and a cup cleaning unit cleaning the cup by supplying a cleaning liquid to the upper part of the cup. A concave portion is formed in the upper part of the cup and the cup cleaning units supply the cleaning liquid to the concave portion in the upper part of the cup.

8 Claims, 9 Drawing Sheets

LIQUID PROCESSING APPARATUS AND LIQUID PROCESSING METHOD

CROSS-REFERENCE TO RELATED APPLICATIONS

This application is based on and claims priorities from Japanese Patent Application Nos. 2011-019629 and 2011-262699, filed on Feb. 1, 2011 and Nov. 30, 2011 with the Japanese Patent Office, respectively, the disclosures of which are incorporated herein in their entireties by reference.

TECHNICAL FIELD

The present disclosure relates to a liquid processing apparatus and a liquid processing method that perform a liquid processing such as cleaning, etching, plating, or developing of a substrate by supplying a processing liquid to the substrate while rotating the substrate held in a horizontal state.

BACKGROUND

Conventionally, various types of apparatuses are knows as a liquid processing apparatus that performs a liquid processing such as cleaning, etching, plating, or developing of a substrate such as a semiconductor wafer (hereinafter, also referred to as a wafer) by supplying a processing liquid to a surface or a rear surface of the substrate while rotating the substrate held in a horizontal state. See, for example, Japanese Patent Application Laid-Open No. 2009-94525 which discloses a single wafer type liquid processing apparatus in which the processing liquid is supplied to the surface of the substrate rotated and held by the spin chuck, thereby processing the substrate one by one. In the single wafer type liquid processing apparatus, a technology has been known where a fan filter unit (FFU) is installed at an upper side of a processing chamber to deliver a gas such as nitrogen ($N_2$ gas) or clean air from the FFU to the processing chamber in a down-flow mode.

Figure 9:
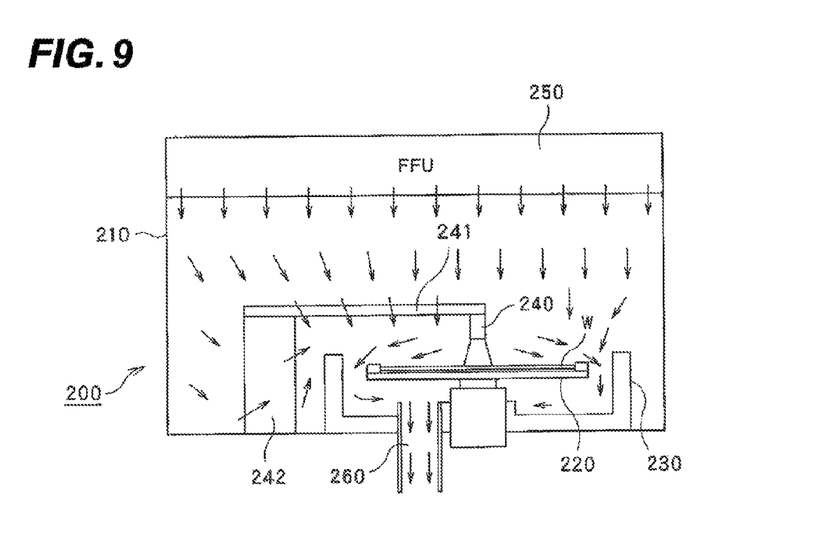
FIG. 9 is a side cross-sectional view illustrating a schematic configuration of a liquid processing apparatus in the related art.
Figure 10:
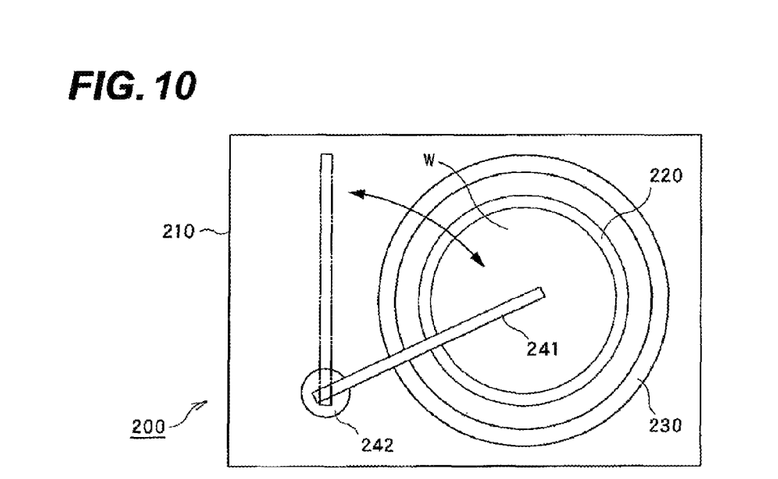
FIG. 10 is a plan view of the liquid processing apparatus in the related art shown in FIG. 9.

A configuration of the liquid processing apparatus where the FFU is installed at an upper side of a processing chamber will be described with reference to FIGS. 9 and 10. FIG. 9 is a side view illustrating a schematic configuration of a conventional liquid processing apparatus and FIG. 10 is a plan view of the conventional liquid processing apparatus shown in FIG. 9. As shown in FIGS. 9 and 10, the conventional liquid processing apparatus 200 includes a processing chamber (chamber) 210 in which a wafer W is received and liquid processing of received wafer W is performed. As shown in FIGS. 9 and 10, a holding unit 220 that holds and rotates wafer W is installed in processing chamber 210, and a cup 230 is disposed around holding unit 220. In conventional liquid processing apparatus 200, a nozzle 240 that supplies a processing liquid from an upper side of cup 230 to wafer W held by holding unit 220, and an arm 241 that supports nozzle 240 are installed in processing chamber 210. An arm supporting portion 242 which extends substantially vertically is installed at arm 241 to support arm 241. Moreover, arm supporting portion 242 is rotated by a driving mechanism (not shown) forwardly and reversely. As a result, arm 241 is rotatable about arm supporting portion 242 forwardly and reversely, and is rotatably moved about arm supporting portion 242 between an advance position (see a solid line in FIG. 10) where a processing liquid is supplied to a wafer W held by holding unit 220 and a retreat position (see an alternate long and two short dashes line in FIG. 10) where arm 241 is retreated from cup 230 (see an arrow in FIG. 10).

As shown in FIG. 9, a fan filter unit (FFU) 250 is installed at the upper side of processing chamber 210, and gas such as nitrogen ($N_2$ gas) or clean air is delivered from FFU 250 to processing chamber 210 in a down-flow mode at all times. An exhaust unit 260 is provided at the bottom of processing chamber 210 and an atmosphere in processing chamber 210 is exhausted through exhaust unit 260. As described above, gas such as clean air is delivered from FFU 250 to processing chamber 210 in the down-flow mode and the gas is exhausted through exhaust unit 260 to substitute the atmosphere in processing chamber 210.

SUMMARY

An exemplary embodiment of the present disclosure provides a liquid processing apparatus, including: a processing chamber in which a substrate holding unit holding a substrate and a cup placed around the substrate holding unit are installed; a nozzle for supplying a processing liquid to the substrate held by the substrate holding unit; and a cup cleaning unit cleaning the cup by supplying a cleaning liquid to the upper part of the cup, and a concave portion is formed in the upper part of the cup and the cup cleaning unit supplies the cleaning liquid to the concave portion in the upper part of the cup.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6A(a) is an enlarged longitudinal cross-sectional view illustrating a configuration of a holding member installed on a holding plate in the liquid processing apparatus shown in FIG. 4, FIG. 6A(b) is an enlarged longitudinal cross-sectional view illustrating a state when a lift-pin plate moves downward from the state shown in FIG. 6A(a), and FIG. 6A(c) is an enlarged longitudinal cross-sectional view illustrating a state when the lift-pin plate moves further downward from the state shown in FIG. 6A(b).

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In a liquid processing apparatus 200 of the related art shown in FIGS. 9 and 10, when a wafer W is subjected to the liquid processing in a processing chamber 210, a chemical liquid is scattered, and as a result, the chemical liquid may be attached and remain onto the top of a cup 230 in processing chamber 210. In this case, in a subsequent processing of wafer W, wafer W may be negatively influenced by an atmosphere of the remaining chemical liquid causing contamination of wafer W.

The present disclosure has been made in an effort to provide a liquid processing apparatus and a liquid processing method that can prevent a substrate in a processing chamber from being contaminated due to contamination attached to a cup by cleaning the cup.

An exemplary embodiment of the present disclosure provides a liquid processing apparatus, including: a processing chamber in which a substrate holding unit holding a substrate and a cup placed around the substrate holding unit are installed; a nozzle for supplying a processing liquid to the substrate held by the substrate holding unit; and a cup cleaning unit cleaning the cup by supplying a cleaning liquid to the upper part of the cup, and a concave portion is formed in the upper part of the cup and the cup cleaning unit supplies the cleaning liquid to the concave portion in the upper part of the cup.

In the liquid processing apparatus of the present disclosure, the upper part of the cup has an inclined structure in which the height level decreases up to the middle portion thereof toward an outer periphery from an inner periphery and the height level increases up to the outer periphery from the middle portion, and the cup cleaning unit may supply the cleaning liquid to the middle portion in the upper part of the cup.

In the liquid processing apparatus of the present disclosure, the height level of the inner periphery of the upper part of the cup may be higher than that of the outer periphery, and the cleaning liquid supplied to the concave portion in the upper part of the cup by the cup cleaning unit may be discharged from the outer periphery of the upper part of the cup.

Alternatively, the height level of the inner periphery of the upper part of the cup may be lower than that of the outer periphery thereof and the cleaning liquid supplied to the concave portion in the upper part of the cup by the cup cleaning unit may be discharged from the inner periphery of the upper part of the cup.

In the liquid processing apparatus of the present disclosure, the cup may be installed in plural to be overlapped with each other in a vertical direction, and the cup cleaning unit may clean an uppermost cup among the plurality of cups.

In the liquid processing apparatus of the present disclosure, a rotational cup rotating together with the substrate holding unit holding the substrate may be installed inside the cup and the cleaning liquid may be widely diffused over the entire area of the concave portion in the upper part of the cup by rotating air current generated with the rotation of the rotational cup.

In the liquid processing apparatus of the present disclosure, the cup cleaning unit may have a cleaning liquid supplying nozzle supplying the cleaning liquid to the concave portion in the upper part of the cup from upward.

In the liquid processing apparatus of the present disclosure, a cylindrical protrusion that protrudes to the outside and extends cylindrically may be installed on the outer periphery of the rotational cup and the rotating air current may be generated by the cylindrical protrusion of the rotational cup.

Another exemplary embodiment of the present disclosure provides a liquid processing method, including: holding a substrate horizontally by a substrate holding unit installed in a processing chamber; rotating the substrate by the substrate holding unit and supplying a processing liquid to the substrate that is held and rotated by the substrate holding unit by a nozzle of a nozzle supporting arm that advances into the processing chamber; and cleaning a cup by supplying a cleaning liquid to a concave portion formed in the upper part of the cup in the processing chamber.

In the liquid processing method of the present disclosure, the height level of the inner periphery of the upper part of the cup may be lower than that of the outer periphery thereof, and the cleaning liquid supplied to the concave portion in the upper part of the cup may be discharged from the inner periphery of the upper part of the cup and an inner periphery surface of the cup may be cleaned by the discharged cleaning liquid, in the cleaning of the cup.

Alternatively, the height level of the inner periphery of the upper part of the cup may be higher than that of the outer periphery thereof, and the cleaning liquid supplied to the concave portion in the upper part of the cup may be discharged from the outer periphery of the upper part of the cup, in the cleaning of the cup.

In the liquid processing method of the present disclosure, a rotational cup rotating together with the substrate holding unit holding the substrate may be installed inside the cup, and the cleaning liquid may be widely diffused across the entire area of the concave portion in the upper part of the cup by rotating air current generated with the rotation of the rotational cup, in the cleaning of the cup.

According to the exemplary embodiments of the present disclosure, the substrate can be prevented from being contaminated due to the contamination attached to the cup.

First Exemplary Embodiment

Figure 1:
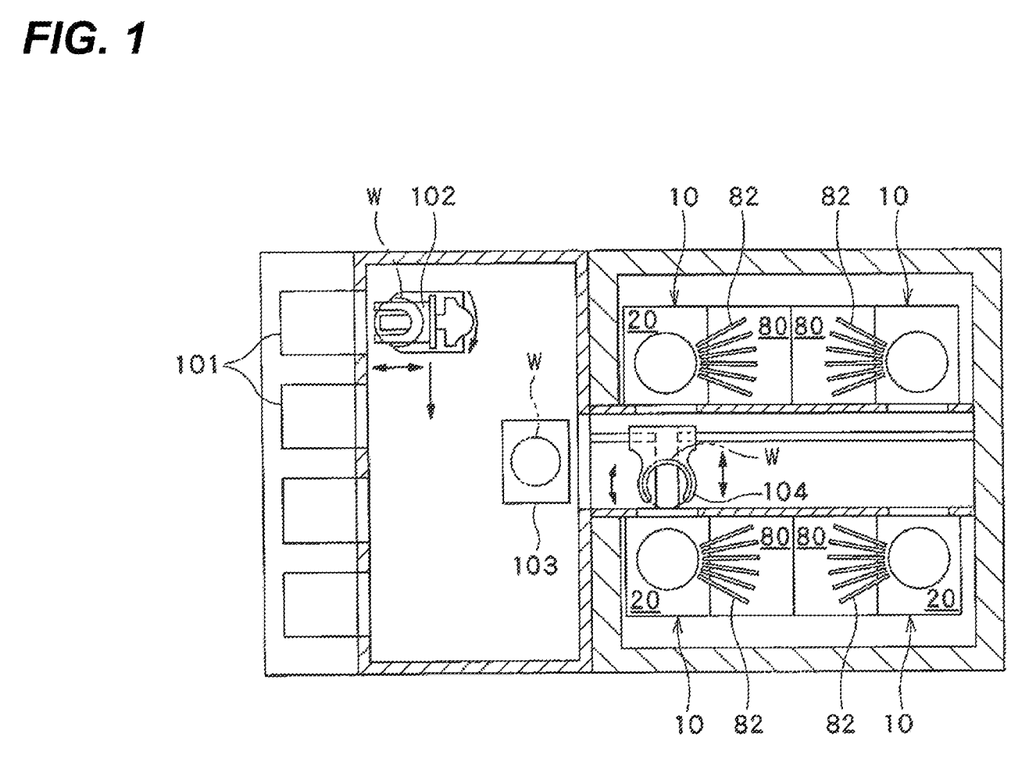
FIG. 1 is a plan view of a liquid processing system including a liquid processing apparatus according to a first exemplary embodiment of the present disclosure when viewed from above.
Figure 2:
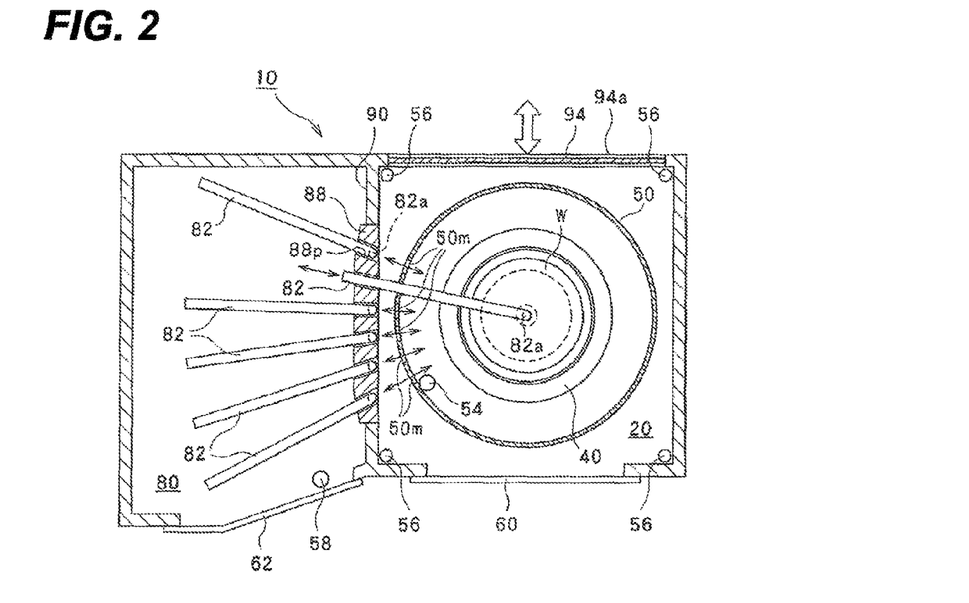
FIG. 2 is a plan view illustrating a schematic configuration of the liquid processing apparatus according to the first exemplary embodiment.
Figure 3:
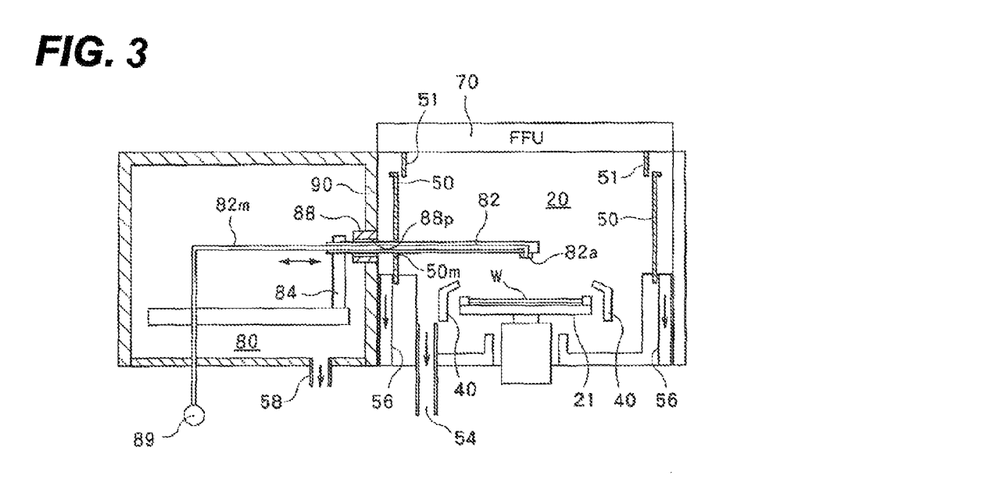
FIG. 3 is a side view of the liquid processing apparatus shown in FIG. 2.
Figure 4:
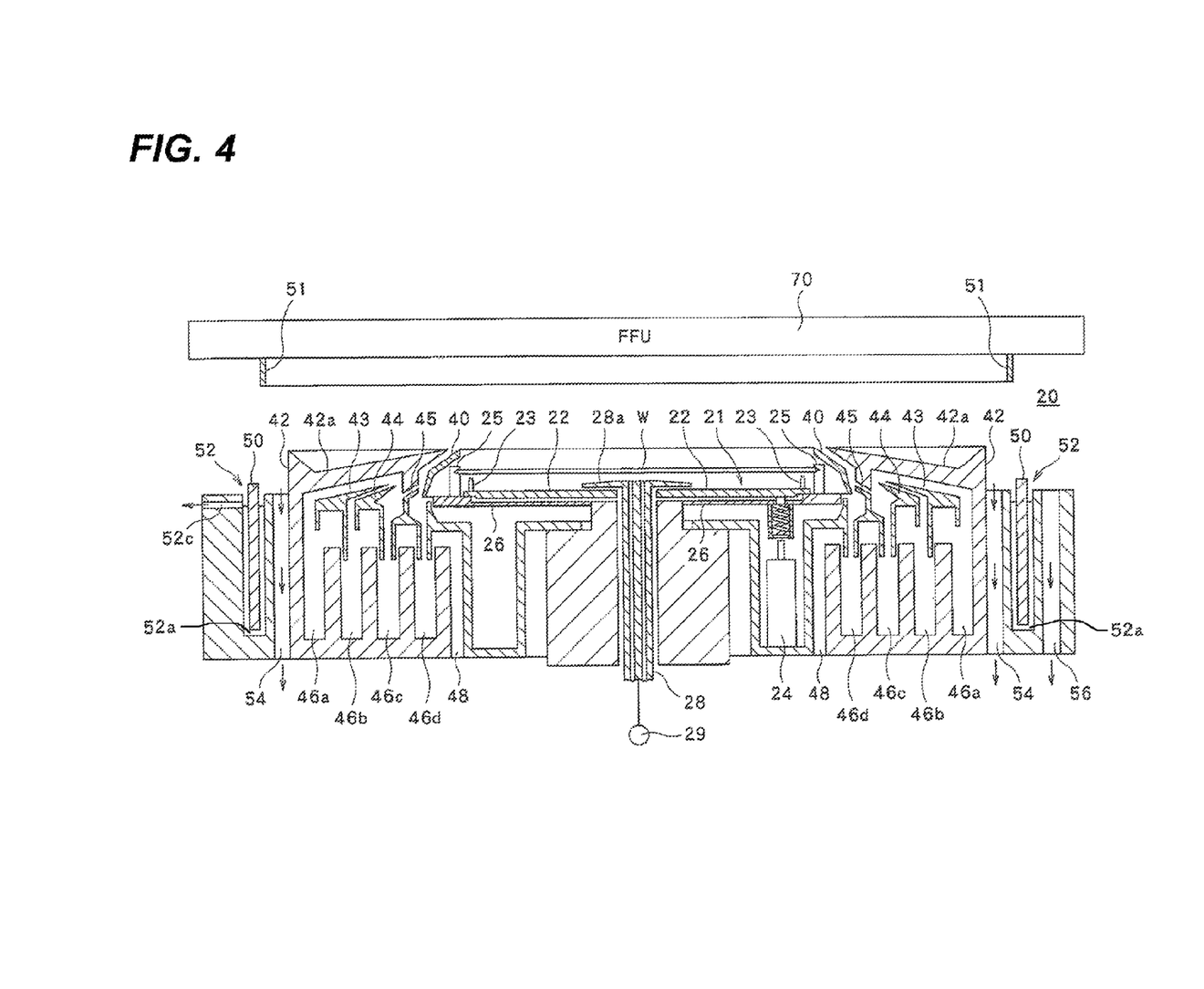
FIG. 4 is a longitudinal cross-sectional view specifically illustrating a configuration of the liquid processing apparatus shown in FIG. 2 and illustrates a state in which a cup peripheral case is at a lower position.
Figure 5:
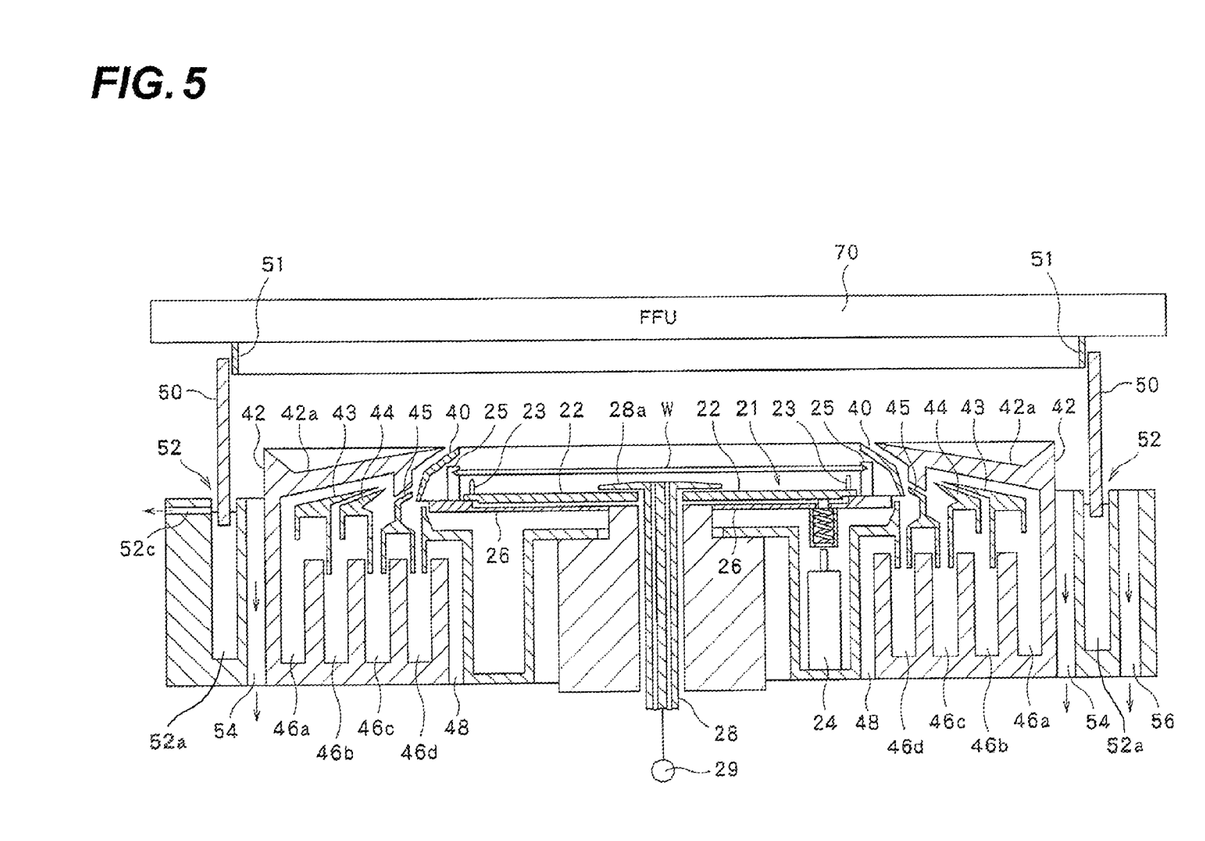
FIG. 5 is a longitudinal cross-sectional view illustrating the configuration of the liquid processing apparatus shown in FIG. 2 in detail and illustrates a state in which the cup peripheral case is at an upper position.
Figure 6A:
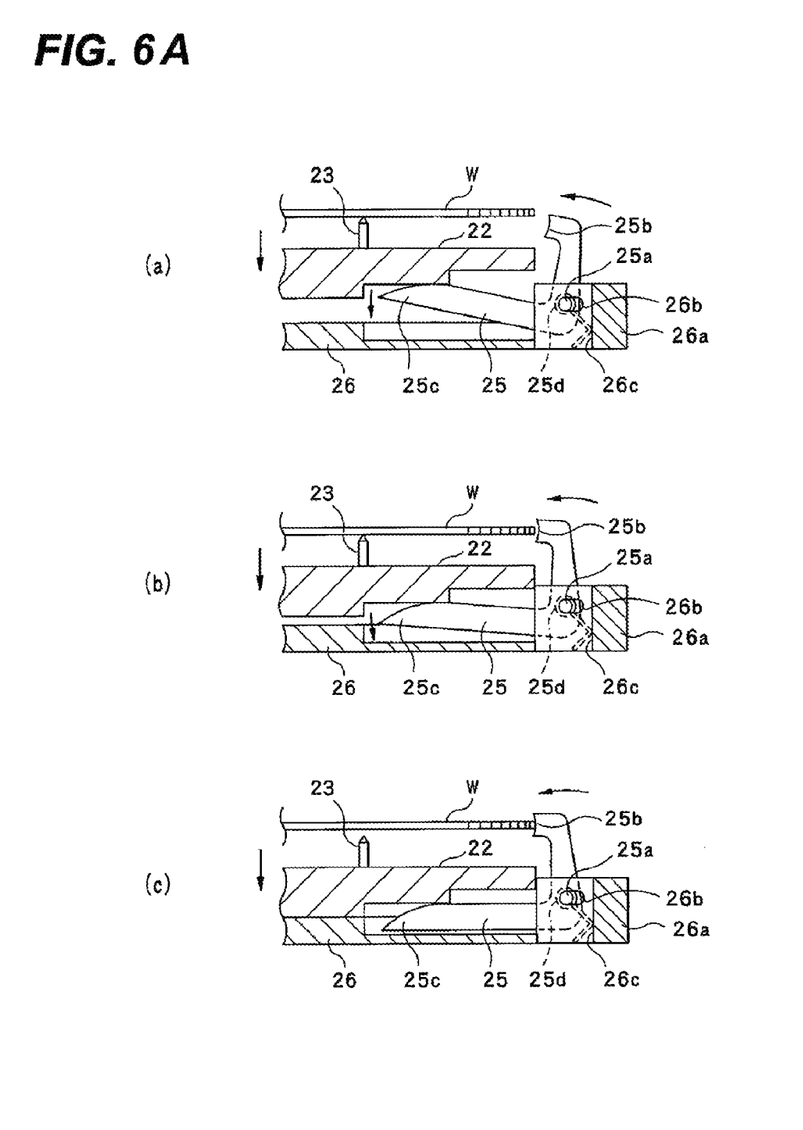
Figure 6B:
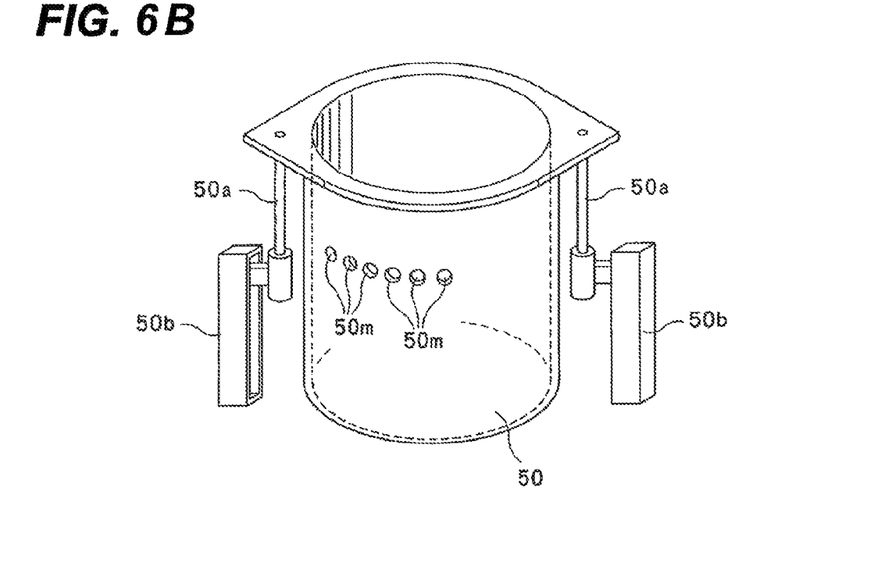
FIG. 6B is a perspective view illustrating a configuration of the cup peripheral case in the liquid processing apparatus shown in FIG. 4.
Figure 7:
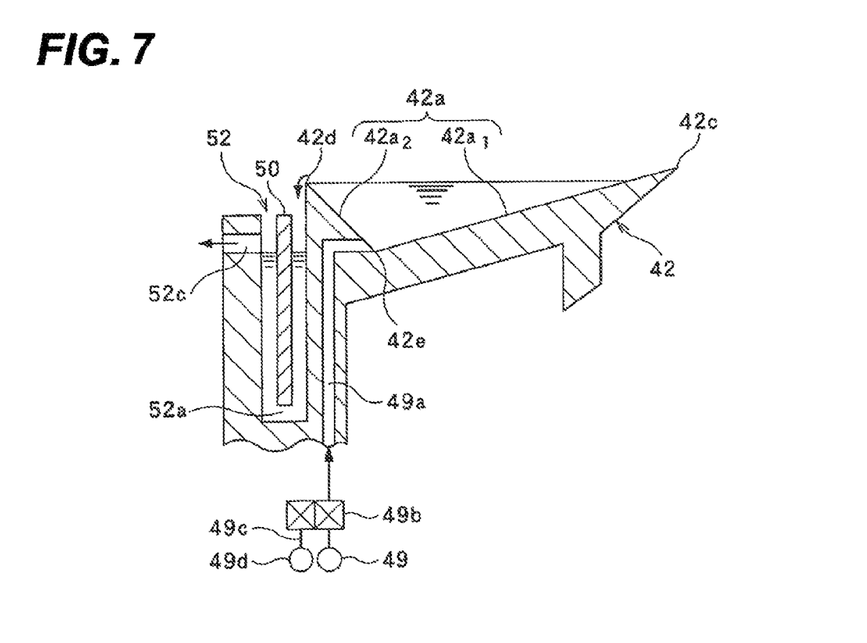
FIG. 7 is a side cross-sectional view specifically illustrating a configuration of a drain cup of the liquid processing apparatus shown in FIG. 4.
Figure 8:
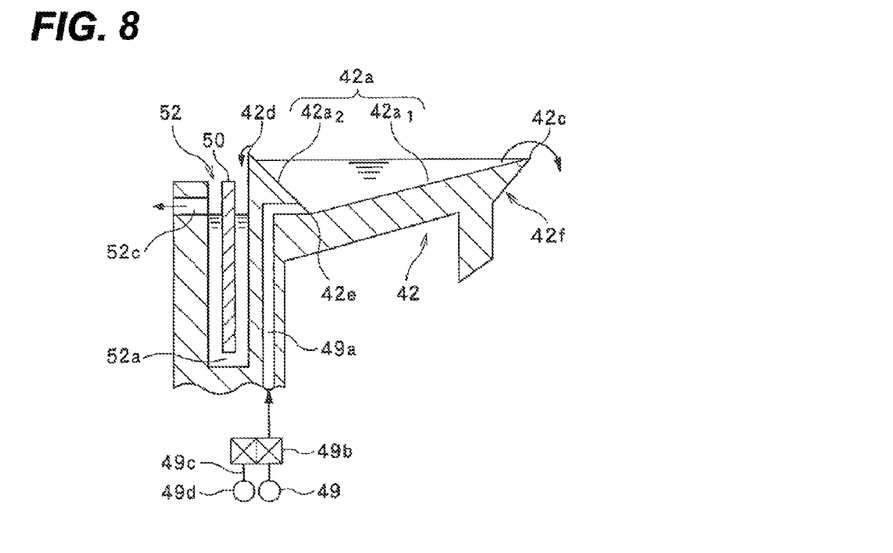
FIG. 8 is a side cross-sectional view specifically illustrating another configuration of the drain cup of the liquid processing apparatus shown in FIG. 4.

Hereinafter, exemplary embodiments of the present disclosure will be described with reference to the accompanying drawings. FIGS. 1 to 8 illustrate a liquid processing apparatus according to an exemplary embodiment of the present disclosure. More specifically, FIG. 1 is a plan view of a liquid processing system including a liquid processing apparatus according to an exemplary embodiment of the present disclosure when viewed from above. FIG. 2 is a plan view illustrating a schematic configuration of the liquid processing apparatus according to the exemplary embodiment of the present disclosure, and FIG. 3 is a side view illustrating the schematic configuration of the liquid processing apparatus shown in FIG. 2. FIGS. 4 and 5 are longitudinal cross-sectional views illustrating the configuration of the liquid processing apparatus shown in FIG. 2 in detail. FIG. 6A is an enlarged longitudinal cross-sectional view illustrating a configuration of a holding member installed on a holding plate in the liquid processing apparatus shown in, for example, FIG. 4, and FIG. 6B is a perspective view illustrating a configuration of the cup peripheral case in the liquid processing apparatus shown in, for example, FIG. 4. FIGS. 7 to 8 are views illustrating a configuration of a nozzle supporting arm installed in the liquid processing apparatus shown in, for example, FIG. 4.

First, referring to FIG. 1, the liquid processing system including the liquid processing apparatus according to the exemplary embodiment of the present disclosure will be described. As shown in FIG. 1, the liquid processing system includes a placing table 101 configured to place a carrier thereon, in which the carrier receives a substrate W such as a semiconductor wafer (hereinafter, also referred to as a wafer W) as a substrate to be processed from the outside, a transfer arm 102 configured to extract wafer W received in the carrier, a rack unit 103 configured to mount wafer W extracted by transfer arm 102, and a transfer arm 104 configured to receive wafer W placed on rack unit 103 and transfers wafer W into a liquid processing apparatus 10. As shown in FIG. 1, in the liquid processing system, a plurality of (four in the exemplary embodiment shown in FIG. 1) liquid processing apparatuses 10 are installed.

Next, a schematic configuration of liquid processing apparatus 10 according to the exemplary embodiment of the present disclosure will be described with reference to FIGS. 2 and 3.

As shown in FIGS. 2 and 3, liquid processing apparatus 10 according to the exemplary embodiment of the present disclosure includes a processing chamber (chamber) 20 in which wafer W is received and liquid processing of received wafer W is performed. As shown in FIG. 3, a holding unit (substrate holding unit) 21 that holds and rotates wafer W horizontally is installed in processing chamber 20 and a ring-shaped rotational cup 40 is disposed around holding unit 21. As shown in FIGS. 2 and 3, a cup peripheral case 50 having a cylindrical shape is disposed around rotational cup 40 in processing chamber 20. As described below, cup peripheral case 50 may be elevated/descended according to the processing status of wafer W. Configurations of holding unit 21, rotational cup 40, and cup peripheral case 50 will be described below in detail.

In liquid processing apparatus 10, a nozzle 82a that supplies a fluid such as a processing liquid or $N_2$ gas from the upper side of wafer W to wafer W held by holding unit 21 and a nozzle supporting arm 82 that supports nozzle 82a are installed. As shown in FIG. 2, a plurality of (specifically, for example, six) nozzle supporting arms 82 are installed in a one liquid processing apparatus 10 and nozzle 82a is installed at the front end of each nozzle supporting arm 82. As shown in FIG. 3, an arm supporting unit 84 is installed at each of nozzle supporting arms 82 and each arm supporting unit 84 is configured to be driven in a left and right direction in FIG. 3 by an arm driving mechanism 85 to be described below. Therefore, each of nozzle supporting arms 82 is rectilinearly moved in a horizontal direction between an advance position where nozzle 82a advances into processing chamber 20 and a retreat position where nozzle 82a retreats from processing chamber 20 (see arrows indicated on each of nozzle supporting arms 82 in FIGS. 2 and 3). As shown in FIG. 3, a surface processing liquid supplying pipe 82m is installed in each of nozzle supporting arms 82 and each of surface processing liquid supplying pipes 82m is connected to a surface processing liquid supplying unit 89. The fluid such as the processing liquid or $N_2$ gas is supplied to nozzle 82a of each of nozzle supporting arms 82 from surface processing liquid supplying unit 89 through each of surface processing liquid supplying pipes 82m.

As shown in FIGS. 2 and 3, in liquid processing apparatus 10, an arm standby unit 80 is installed adjacent to processing chamber 20. Nozzle supporting arm 82 that has retreated from processing chamber 20 stands by in arm standby unit 80. A wall 90 which is extended in a vertical direction is installed between arm standby unit 80 and processing chamber 20. Wall 90 includes an arm cleaning unit 88 provided with an opening 88p through which each of nozzle supporting arms 82 can pass, respectively. Each of nozzle supporting arms 82 is cleaned by arm cleaning unit 88.

As shown in FIG. 3, a fan filter unit (FFU) 70 is installed at the upper side of processing chamber 20 and gas such as $N_2$ gas (nitrogen gas) or clean air is delivered to processing chamber 20 from FFU 70 in a down-flow mode. As shown in FIGS. 2 and 3, an exhaust unit 54 is installed inside cup peripheral case 50 on the bottom of processing chamber 20, and an atmosphere in processing chamber 20 is exhausted by exhaust unit 54. As described above, the gas such as clean air is delivered to processing chamber 20 from FFU 70 in the down-flow mode and the gas is exhausted by exhaust unit 54 to substitute the atmosphere in processing chamber 20.

As shown in FIGS. 2 and 3, an exhaust unit 56 is installed outside cup peripheral case 50 on the bottom of processing chamber 20 and the atmosphere in processing chamber 20 is exhausted by exhaust unit 56. An atmosphere outside cup peripheral case 50 in processing chamber 20 may be exhausted by exhaust unit 56. Specifically, exhaust unit inhibits an atmosphere in arm standby unit 80 from traveling into cup peripheral case 50. Exhaust unit 56 inhibits the atmosphere in cup peripheral case 50 from traveling to arm standby unit 80.

As shown in FIGS. 2 and 3, an exhaust unit 58 is installed on the bottom of arm standby unit 80 and the atmosphere in arm standby unit 80 is exhausted by exhaust unit 58. Specifically, it is possible to expel particles generated from an arm driving mechanism (not shown) for driving each of nozzle supporting arms 82 by exhaust unit 58.

As shown in FIG. 2, maintenance shutters 60 and 62 are installed at entrances of processing chamber 20 and arm standby unit 80 of liquid processing apparatus 10, respectively. Maintenance shutters 60 and 62 are installed in processing chamber 20 and arm standby unit 80, respectively, to maintain devices in processing chamber 20 or arm standby unit 80 individually. Even while wafer W is being processed in processing chamber 20, the devices in arm standby unit 80 may be maintained by opening shutter 62.

As shown in FIG. 2, an opening 94a for carrying in/out wafer W to/from processing chamber 20 by transfer arm 104 is provided on a side wall of liquid processing apparatus 10, and a shutter 94 for opening/closing opening 94a is installed in opening 94a.

In liquid processing apparatus 10 shown in FIG. 2, a region inside cup peripheral case 50 in processing chamber 20 is under minute positive pressure compared to a clean room, while a region outside cup peripheral case 50 in processing chamber 20 is under minute negative pressure compared to the clean room. As a result, in processing chamber 20, the atmospheric pressure of the region inside cup peripheral case 50 is larger than the atmospheric pressure of the region outside cup peripheral case 50.

Next, the configuration of liquid processing apparatus 10 shown in FIGS. 2 and 3 will be described in detail with reference to FIGS. 4 and 5.

As shown in FIGS. 4 and 5, holding unit 21 includes a disk-shaped holding plate 26 that supports wafer W and a disk-shaped lift-pin plate 22 installed at an upper side of holding plate 26. Three lift pins 23 that support wafer W from below are installed on the top surface of lift-pin plate 22 with equal spacing in a circumferential direction. In FIGS. 4 and 5, only two lift pins 23 are shown. A piston mechanism 24 is installed on lift-pin plate 22 and lift-pin plate 22 is elevated/descended by piston mechanism 24. More specifically, when wafer W is put on lift pins 23 or wafer W is extracted from lift pins 23 by transfer arm 104 (see FIG. 1), lift-pin plate 22 is moved upwardly from a position shown in, for example, FIG. 4 by piston mechanism 24 to position lift-pin plate 22 above rotational cup 40. Meanwhile, when wafer W is subjected to liquid processing in processing chamber 20, lift-pin plate 22 is moved to a lower position shown in, for example, FIG. 4 by piston mechanism 24 to position rotational cup 40 around wafer W.

Three holding members 25 that support wafer W at lateral sides are installed on holding plate 26 with equal spacing in the circumferential direction. In FIGS. 4 and 5, only two holding members 25 are shown. When lift-pin plate 22 is moved from the upper position to the lower position shown in FIGS. 4 and 5, each of holding members 25 supports wafer W on lift pins 23 and makes wafer W slightly separated from lift pins 23.

The configurations of lift-pin plate 22 and holding plate 26 will be described in more detail with reference to FIG. 6A. In FIG. 6A, (a) is a diagram illustrating a state while lift-pin plate 22 moves from the upper position to the lower position shown in, for example, FIG. 4, (b) is a diagram illustrating a state when lift-pin plate 22 moves downward from the state shown in (a), and (c) is a diagram illustrating a state when lift-pin plate 22 moves further downward from the state shown in (b) to reach the lower position shown in, for example, FIG. 4.

As shown in FIG. 6A, holding member 25 is pivotably supported on holding plate 26 through a shaft 25a. More specifically, as shown in FIG. 6A, a bearing part 26a is attached to holding plate 26 and shaft 25a is received in a bearing hole 26b installed in bearing part 26a. Bearing hole 26b is configured by an elongate hole that extends horizontally and shaft 25a of holding member 25 may move horizontally along bearing hole 26b. Therefore, holding member 25 may swing around shaft 25a received in bearing hole 26b of bearing part 26a.

A spring member 25d such as a torsion spring is wound on shaft 25a of holding member 25. Spring member 25d applies to holding member 25 force to rotate holding member 25 around shaft 25a in a clockwise direction in FIG. 6A. As a result, when no force is applied to holding member 25, holding member 25 is inclined to holding pate 26, and as a result, a support part 25b (to be described below) of holding member 25 to support wafer W from the side is distant from the center of holding plate 26.

A linear part extends from spring member 25d wound on shaft 25a and the linear part is locked onto an inner wall surface 26c of bearing part 26a to restore shaft 25a toward the center of holing plate 26. Therefore, shaft 25a is continuously pressed toward the center of holding plate 26 (that is, toward the left direction in FIG. 6A) by the linear part of spring member 25d. As a result, when wafer W having a relatively small diameter is held by holding member 25, shaft 25a is positioned at a position (that is, a left position in FIG. 6A) in bearing hole 26b adjacent to the center of holding plate 26, as shown in FIG. 6A. Meanwhile, when wafer W having a relatively large diameter is held by holding member 25, shaft 25a is moved in a right direction from the position shown in FIG. 6A along bearing hole 26b against the force by the linear part of spring member 25d. The size of the diameter of wafer W represents the size of the diameter of wafer W within an allowable size error.

Holding member 25 includes support part 25b that supports wafer W from the lateral side and a pressed member 25c installed at an opposite side to support part 25b with respect to shaft 25a. Pressed member 25c is installed between lift-pin plate 22 and holding plate 26 and pressed member 25c is pressed downward by the bottom surface of corresponding lift-pin plate 22 when lift-pin plate 22 is positioned at the lower position or a position adjacent thereto as shown in FIG. 6A.

As shown in FIG. 6A, when lift-pin plate 22 is moved from the upper position to the lower position, pressed member 25c is pressed downward by the bottom surface of corresponding lift-pin plate 22, such that holding member 25 rotates in a counterclockwise direction (an arrow direction in FIG. 6A) in FIG. 6A around shaft 25a. Holding member 25 rotates around shaft 25a, such that support part 25b is moved toward wafer W from the lateral side of wafer W. As a result, when lift-pin plate 22 is reached to the lower position, wafer W is supported from the lateral side by holding member 25 as shown in FIG. 6A(c). Herein, as shown in FIG. 6A(c), when wafer W is supported from the lateral side by holding member 25, wafer W is separated from the front end of lift pin 23 to the upper side to float above lift pin 23. As described above, according to the size of wafer W, shaft 25a may be moved in the right direction from the position shown in FIG. 6A along bearing hole 26b against the force by the linear part of spring member 25d. As a result, even when wafer W having a relatively large size is supported by holding member 25, holding member 25 is movable horizontally, and as a result, holding member 25 may support wafer W from the lateral side without deforming or damaging of wafer W.

Through-holes are formed at the centers of lift-pin plate 22 and holding plate 26 respectively, and a processing liquid supplying pipe 28 is installed to pass through the through-holes. Processing liquid supplying pipe 28 supplies a processing liquid such as a chemical liquid or deionized water to a rear surface of wafer W held by each of holding members 25 of holding plate 26. Processing liquid supplying pipe 28 may elevate/descend by being interlocked with lift-pin plate 22. A head part 28a is formed at an upper end of processing liquid supplying pipe 28 to close the through hole of lift pin plate 22. As shown in FIG. 4, processing liquid supplying unit 29 is connected to processing liquid supplying pipe 28 and the processing liquid is supplied to processing liquid supplying pipe 28 by processing liquid supplying unit 29.

As shown in FIGS. 4 and 5, a ring-shaped rotational cup 40 is disposed around holding unit 21. Rotational cup 40 is attached to holding plate 26 and is rotated integrally with holding plate 26. More specifically, rotational cup 40 is installed to surround wafer W supported by each of holding members 25 of holding plate 26 from the lateral sides and receives the processing liquid laterally scattered from the wafer W when wafer W is subjected to liquid processing.

A drain cup 42, a first guide cup 43, a second guide cup 44, and a third guide cup 45 are installed in sequence from above around rotational cup 40. Drain cup 42 and each of guide cups 43, 44, and 45 are formed in a ring shape. Herein, drain cup 42 is fixed in processing chamber 20. Meanwhile, elevating/descending cylinders (not shown) are connected to each of guide cups 43, 44, and 45 respectively, and guide cups 43, 44, and 45 may be independently elevated/descended by corresponding elevating/descending cylinders.

As shown in FIGS. 4 and 5, a first processing liquid recovering tank 46a, a second processing liquid recovering tank 46b, a third processing liquid recovering tank 46c, and a fourth processing liquid recovering tank 46d are installed at lower sides of drain cup 42 or each of guide cups 43, 44, and 45, respectively. The processing liquid laterally scattered from wafer W during the liquid processing of wafer W is selectively delivered to any one of four processing liquid recovering tanks 46a, 46b, 46c, and 46d according to vertical positions of each of guide cups 43, 44, and 45 based on the type of the processing liquid. Specifically, when all guide cups 43, 44, and 45 are disposed at an upper position (the state as shown in FIGS. 4 and 5), the processing liquid laterally scattered from wafer W is delivered to fourth processing liquid recovering tank 46d. Meanwhile, when only third guide cup 45 is at a lower position, the processing liquid laterally scattered from wafer W is delivered to third processing liquid recovering tank 46c. When second and third guide cups 44 and 45 are disposed at the lower position, the processing liquid laterally scattered from wafer W is delivered to second processing liquid recovering tank 46b. When all guide cups 43, 44, and 45 are at the lower position, the processing liquid laterally scattered from wafer W is delivered to first processing liquid recovering tank 46a.

As shown in FIGS. 4 and 5, an exhaust unit 48 is installed at inner side of fourth processing liquid recovering tank 46d. The vertical positions of guide cups 43, 44, and 45 become predetermined positions, such that an atmosphere around wafer W is exhausted by exhaust unit 48.

In liquid processing apparatus 10 of the exemplary embodiment of the present disclosure, cup peripheral case 50 is installed around drain cup 42 or guide cups 43, 44, and 45 in processing chamber 20. Cup peripheral case 50 may be elevated/descended between a lower position as shown in FIG. 4 and an upper position as shown in FIG. 5. As shown in FIGS. 2 and 3, an opening 50m through which nozzle supporting arm 82 can pass is provided on cup peripheral case 50. When cup peripheral case 50 is at the upper position as shown in FIG. 5, the region inside cup peripheral case 50 is isolated from the outside.

The configuration of cup peripheral case 50 will be described in detail with reference to FIG. 6B. FIG. 6B is a perspective view illustrating the configuration of cup peripheral case 50. As shown in FIG. 6B, openings 50m through which nozzle supporting arms 82 can pass are provided on the side of cup peripheral case 50 according to the number of nozzle supporting arms 82 (for example, when the number of nozzle supporting arms 82 is six, six openings 50m are provided). Support members 50a that support cup peripheral case 50 are connected to the upper portion of cup peripheral case 50 and driving mechanisms 50b that elevate/descend support members 50a are installed in support member 50a. Support members 50a are elevated/descended by driving mechanisms 50b, and as a result, cup peripheral case 50 supported by support members 50a is also elevated/descended.

As shown in FIGS. 4 and 5, a guide member 51 is attached to FFU 70. When cup peripheral case 50 is disposed at the upper position as shown in FIG. 5, guide member 51 is placed to be positioned at a narrow distance on the inward side from cup peripheral case 50. In liquid processing apparatus 10 of the exemplary embodiment of the present disclosure, when cup peripheral case 50 is disposed at the upper position as shown in FIG. 5, the atmospheric pressure inside cup peripheral case 50 is larger than the atmospheric pressure outside cup outer peripheral case 50. Therefore, when cup peripheral case 50 is disposed at the upper position, a down-flow gas in processing chamber 20 generated by FFU 70 is guided from the inside of cup peripheral case 50 to the outside thereof around the upper end of cup peripheral case 50 by guide member 51.

As shown in FIGS. 4 and 5, a cleaning unit 52 that cleans cup peripheral case 50 is installed in processing chamber 20. Cleaning unit 52 has a storage part 52a that receives a cleaning liquid such as deionized water and when cup peripheral case 50 is disposed at the lower position as shown in FIG. 4, cup peripheral case 50 is immersed in the cleaning liquid stored in storage part 52a. Cup peripheral case 50 is immersed in the cleaning liquid stored in storage part 52a, and as a result, cleaning unit 52 cleans cup peripheral case 50. As the cleaning liquid stored in storage part 52a, for example, deionized water having a room temperature or higher, preferably 40° C. or higher, and more preferably 60° C. or higher is used. When the temperature of the cleaning liquid stored in storage part 52a is high, a cleaning effect on cup peripheral case 50 is further increased.

As shown in FIG. 4, when cup peripheral case 50 is at the lower position, most of cup peripheral case 50 is immersed in the cleaning liquid reserved in reserving part 52a. As shown in FIG. 5, even when cup peripheral case 50 is at the upper position, a lower part of cup peripheral case 50 is immersed in the cleaning liquid reserved in reserving part 52a. As a result, when cup peripheral case 50 is at the upper position, water sealing is performed between the cleaning liquid reserved in reserving part 52a and the lower part of cup peripheral case 50 and a space between the upper part of cup peripheral case 50 and guide member 51 is narrowed, and as a result, the inner area of cup peripheral case 50 may be isolated from the outside.

As shown in FIGS. 4 and 5, exhaust unit 54 that exhausts the atmosphere in processing chamber 20 is installed inside cleaning unit 52 and an exhaust unit 56 that exhausts the atmosphere in processing chamber 20 is installed outside cleaning unit 52. By installing exhaust units 54 and 56, all the atmosphere in processing chamber 20 can be exhausted by exhaust units 54 and 56 when cup peripheral case 50 is at the lower position as shown in FIG. 4. Meanwhile, when cup peripheral case 50 is disposed at the upper position as shown in FIG. 5, the region inside cup peripheral case 50 is isolated from the outside, and as a result, the atmosphere inside cup peripheral case 50 can be exhausted by exhaust unit 54 and the atmosphere outside cup peripheral case 50 can be exhausted by exhaust unit 56.

As described above, in the exemplary embodiment of the present disclosure, the plurality of (specifically, for example, six) nozzle supporting arms 82 are installed in one liquid processing apparatus 10 and nozzles 82a are installed at the front ends of each of nozzle supporting arms 82a, respectively. Specifically, nozzles 82a supply a first chemical liquid (for example, an acid chemical liquid), a second chemical liquid (for example, an alkaline chemical liquid), deionized water, $N_2$ gas, isopropyl alcohol (IPA), and mist of deionized water to the top surface of wafer W, respectively.

Next, a configuration of a drain cup 42 placed around rotational cup 40 in a processing chamber 20 will described below in detail. As shown in FIGS. 4 and 5, a concave portion 42a is formed in an upper part of drain cup 42. A configuration of concave portion 42a will be described in detail with reference to FIG. 7.

As shown in FIG. 7, in the upper part of drain cup 42, a first inclination portion $42a_1$ of which a height level is slowly decreased up to a middle portion 42e toward an outer periphery 42d from an inner periphery 42c and a second inclination portion 42a$_2$ of which a height level is slowly increased up to outer periphery 42d from middle portion 42e are formed. Concave portion 42a is constituted by first inclination portion 42a$_1$ and second inclination portion 42a$_2$. In drain cup 42 shown in FIG. 7, the height level of inner periphery 42c is higher than that of outer periphery 42d.

A cleaning liquid supplying pipe 49a is joined to middle portion 42e installed in the upper part of drain cup 42 and a cleaning liquid supplying unit 49 is joined to cleaning liquid supplying pipe 49a. A cleaning liquid is supplied to cleaning liquid supplying pipe 49a from cleaning liquid supplying unit 49. Therefore, the cleaning liquid is sent into concave portion 42a from cleaning liquid supplying pipe 49a to be stored in concave portion 42a. As a result, drain cup 42 is cleaned by the cleaning liquid supplied to concave portion 42a in the upper part of drain cup 42 from cleaning liquid supplying unit 49. In the exemplary embodiment, a drain cup cleaning unit for cleaning drain cup 42 is constituted by cleaning liquid supplying unit 49 and cleaning liquid supplying pipe 49a. The cleaning of drain cup 42 by the drain cup cleaning unit is performed, for example, for each processing, once a day or once a month.

A switching valve 49b is installed in cleaning liquid supplying pipe 49a and a drain line 49c is joined to switching valve 49b. Drain line 49c is in communication with concave portion 42a of drain cup 42 by switching valve 49b to discharge the cleaning liquid that remains in concave portion 42a to drain portion 49d by drain line 49c.

Herein, in drain cup 42 shown in FIG. 7, since the height level of inner periphery 42c is higher than that of outer periphery 42d, the cleaning liquid supplied to concave portion 42a in the upper part of drain cup 42 by cleaning liquid supplying unit 49 is discharged to the outside (to the left side in FIG. 7) from outer periphery 42d of the upper part of drain cup 42. The cleaning liquid discharged from outer periphery 42d of the upper part of drain cup 42 is sent to storage part 52a of cleaning unit 52 and stored in storage part 52a. Thereafter, the cleaning liquid in storage part 52a is discharged to the outside of the apparatus by a drain pipe 52c installed on the side of storage part 52a.

Drain cup 42 installed in liquid processing apparatus 10 of the exemplary embodiment is not limited to the configuration shown in FIG. 7. Drain cup 42 in which the height level of inner periphery 42c is lower than that of outer periphery 42d may be used as shown in FIG. 8. In this case, the cleaning liquid supplied to concave portion 42a in the upper part of drain cup 42 by cleaning liquid supplying unit 49 is discharged to the inside (to the right side in FIG. 8) from inner periphery 42c of the upper part of drain cup 42. In this case, an inner peripheral surface 42f of drain cup 42 or rotational cup 40 can be cleaned by the cleaning liquid supplied to concave portion 42a in the upper part of drain cup 42 by cleaning liquid supplying unit 49. The cleaning liquid is supplied to inner peripheral surface 42f of drain cup 42 or rotational cup 40 and thereafter, rotational cup 40 is rotated to dry inner peripheral surface 42f of drain cup 42 or rotational cup 40.

Drain cup 42 in which the height level of inner periphery 42c is substantially equal to that of outer periphery 42d may be used. In this case, the cleaning liquid supplied to concave portion 42a in the upper part of drain cup 42 by cleaning liquid supplying unit 49 is discharged from both inner periphery 42c and outer periphery 42d of the upper part of drain cup 42.

Next, an operation of liquid processing apparatus 10 having the configuration will be described.

First, lift-pin plate 22 and processing liquid supplying pipe 28 in holding unit 21 are moved from the position shown in FIG. 4 upward and shutter 94 installed in opening 94a of processing chamber 20 is retreated from opening 94a to open opening 94a. Wafer W is transferred into processing chamber 20 from the outside of liquid processing apparatus 10 through opening 94a by transfer arm 104 and placed on lift pins 23 of lift-pin plate 22 and thereafter, transfer arm 104 retreats from processing chamber 20. In this case, cup peripheral case 50 is disposed at the lower position as shown in FIG. 4. Each of nozzle supporting arms 82 is positioned at the retreat position of retreating from processing chamber 20. That is, each of nozzle supporting arms 82 stands by in arm standby unit 80. The gas such as clean air is delivered to processing chamber 20 from FFU 70 in the down-flow mode continuously and exhausted by exhaust unit 54 to substitute the atmosphere in processing chamber 20.

Next, lift-pin plate 22 and processing liquid supplying pipe 28 are moved downward to be positioned at the lower position shown in FIG. 4. In this case, each of holding members 25 installed on holding plate 26 supports wafer W on lift pins 23 to slightly separate wafer W from lift pins 23.

Thereafter or during lowering lift-pin plate 22, cup peripheral case 50 is moved to the upper side by driving mechanism 50b installed in cup peripheral case 50 to position cup peripheral case 50 at the upper position shown in FIG. 5. After cup peripheral case 50 is moved to the upper position, one or plural nozzle supporting arms 82 of six nozzle supporting arms 82 that stand by in arm standby unit 80 advance into processing chamber 20 through opening 88p of arm cleaning unit 88 of wall 90 and one of openings 50m of cup peripheral case 50 (see two-dot chain line of FIG. 5). In this case, nozzle supporting arm 82 is rectilinearly moved by arm driving mechanism 85.

Next, a holding plate 26 and a lift-pin plate 22 in a holding unit 21 are rotated. As a result, wafer W supported by each holding member 25 of holding plate 26 is also rotated. While wafer W is rotating, a processing liquid is supplied onto the top surface of wafer W from nozzle 82a of nozzle supporting arm 82 that has advanced into processing chamber 20. In this case, the processing liquid such as a chemical liquid or deionized water is supplied toward the bottom surface (rear surface) of wafer W from a processing liquid supplying pipe 28. Therefore, the processing liquid is supplied to both the top surface and the bottom surface of wafer W to perform the liquid processing of wafer W. Each of guide cups 43, 44, and 45 is positioned at an upper position or a lower position, and as a result, the processing liquid supplied to wafer W is selectively sent and recovered to any one processing liquid recovering tank of four processing liquid recovering tanks 46a, 46b, 46c, and 46d based on a type of the processing liquid.

Thereafter, when the liquid processing of wafer W is completed, nozzle supporting arm 82 that has advanced into processing chamber 20 retreats from processing chamber 20 to stand by in arm standby unit 80. A cup outer peripheral case 50 is moved downward by driving mechanism 50b installed in cup outer peripheral case 50 to position cup outer peripheral case 50 at the lower position shown in FIG. 4.

Thereafter, lift-pin plate 22 and processing liquid supplying pipe 28 in holding unit 21 are moved upward from the position as shown in FIG. 4. In this case, wafer W held by holding members 25 of holding plate 26 is transferred onto lift pins 23 of lift-pin plate 22. Next, shutter 94 installed in opening 94a of processing chamber 20 retreats from opening 94a to open opening 94a. Transfer arm 104 advances into processing chamber 20 through opening 94a from the outside of liquid processing apparatus 10 and wafer W on lift pin 23 of lift-pin plate 22 is transferred to transfer arm 104. Wafer W transferred to transfer arm 104 is transferred to the outside of liquid processing apparatus 10. As such, a series of the liquid processings of wafer W are completed.

Drain cup 42 is cleaned by supplying the cleaning liquid to concave portion 42a in the upper part of drain cup 42 from cleaning liquid supplying unit 49. Drain cup 42 may be cleaned after each processing of wafer W or periodically.

After the cleaning of drain cup 42 is completed, concave portion 42a of drain cup 42 and drain line 49c are in communication with each other by switching valve 49b to discharge the cleaning liquid that remains in concave portion 42a in the upper part of drain cup 42 to drain portion 49d by drain line 49c.

As described above, according to liquid processing apparatus 10 of the exemplary embodiment, drain cup 42 is placed around holding unit 21 in processing chamber 20 and the cleaning liquid is supplied to the upper part of drain cup 42 to clean corresponding drain cup 42 by the drain cup cleaning unit constituted by cleaning liquid supplying unit 49 and cleaning liquid supplying pipe 49a. In this case, concave portion 42a is formed in the upper part of drain cup 42 and the cleaning liquid is supplied to concave portion 42a in the upper part of the drain cup by cleaning liquid supplying unit 49. As a result, the cleaning liquid can be stored in concave portion 42a in the upper part of the drain cup to clean drain cup 42 by the cleaning liquid stored in concave portion 42a. As described above, it is possible to prevent contamination of wafer W caused by contaminations attached to drain cup 42 positioned in processing chamber 20 by cleaning drain cup 42.

In liquid processing apparatus 10 of the exemplary embodiment, the upper part of drain cup 42 is inclined so that the height level decreases up to middle portion 42e toward outer periphery 42d from inner periphery 42c (first inclination portion $42a_1$) and inclined so that the height level increases up to outer periphery 42d from middle portion 42e (second inclination portion $42a_2$), and the cleaning liquid is supplied to middle portion 42e of the upper part of drain cup 42 by cleaning liquid supplying unit 49. Middle portion 42e is positioned on the bottom of concave portion 42a of drain cup 42.

In liquid processing apparatus 10 of the exemplary embodiment, since the height level of inner periphery 42c of the upper part of drain cup 42 is higher than that of outer periphery 42d as shown in FIG. 7, the cleaning liquid supplied to concave portion 42a in the upper part of drain cup 42 by cleaning liquid supplying unit 49 is discharged from outer periphery 42d of the upper part of drain cup 42. In this case, the cleaning liquid supplied to the upper part of drain cup 42 by cleaning liquid supplying unit 49 is discharged to storage part 52a of cleaning unit 52 for cleaning cup outer peripheral case 50. According to liquid processing apparatus 10, since the processing liquid such as the chemical liquid used to process wafer W and the cleaning liquid for cleaning drain cup 42 can be separated from each other, the liquids can be prevented from being mixed in processing chamber 20.

Alternatively, as shown in FIG. 8, the height level of inner periphery 42c of the upper part of drain cup 42 is lower than that of outer periphery 42d thereof, and the cleaning liquid supplied to concave portion 42a in the upper part of drain cup 42 by cleaning liquid supplying unit 49 is discharged from inner periphery 42c in the upper part of drain cup 42. In this case, inner peripheral surface 42f of drain cup 42 or rotational cup 40 may be cleaned by the cleaning liquid supplied to concave portion 42a in the upper part of drain cup 42 by cleaning liquid supplying unit 49.

In liquid processing apparatus 10 of the exemplary embodiment, drain cup 42, a first guide cup 43, a second guide cup 44, and a third guide cup 45 may be installed in plural to be overlapped with each other in a vertical direction and the cleaning liquid is sent to drain cup 42 which are positioned at the uppermost end among the plurality of cups, to clean drain cup 42.

The liquid processing apparatus of the exemplary embodiment is not limited to the aspects as described above and can be modified variously. For example, the processing liquid is not needed to be supplied onto both top and back surfaces of wafer W using nozzle 82a of nozzle supporting arm 82 that has advanced into processing chamber 20 and processing liquid supplying pipe 28. The processing liquid may be supplied only to the top surface of wafer W using nozzle 82a of nozzle supporting arm 82. The liquid processing apparatus of the exemplary embodiment may also be used for processing such as etching processing, plating processing, and development processing in addition to the cleaning processing of the substrate.

Second Exemplary Embodiment

Next, a second exemplary embodiment of the present disclosure will be described with reference to FIGS. 11 and 12. The second exemplary embodiment shown in FIGS. 11 and 12 is different from the first exemplary embodiment shown in FIGS. 1 to 8 only in a cleaning structure of drain cup 42 constituted by rotational cup 40 and drain cup 42 and other configurations thereof except for the cleaning structure are substantially the same as those of the first exemplary embodiment.

Figure 11:
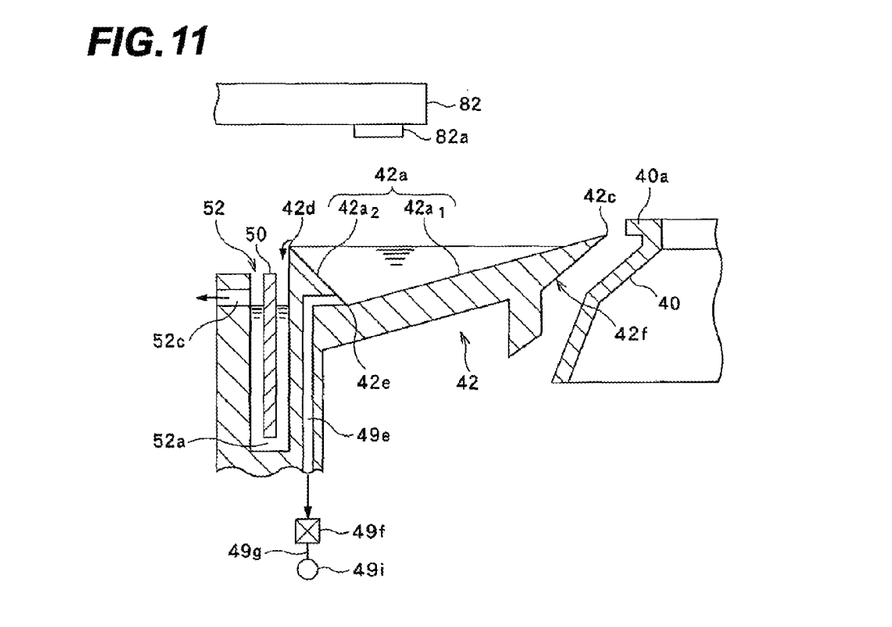
FIG. 11 is a side cross-sectional view specifically illustrating a configuration of a drain cup of a liquid processing apparatus according to a second exemplary embodiment of the present disclosure.
Figure 12:
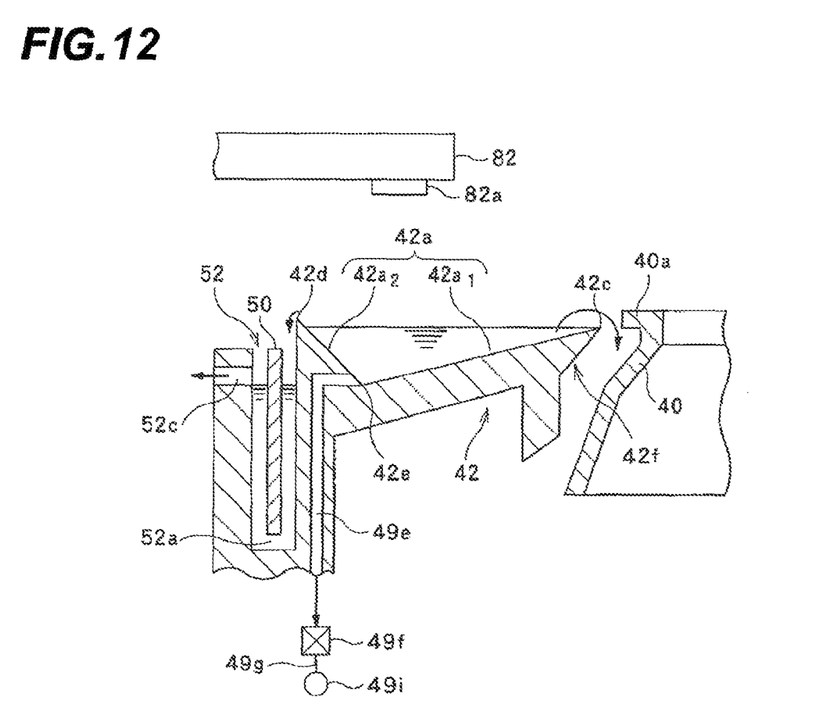
FIG. 12 is a side cross-sectional view specifically illustrating another configuration of the drain cup.

In FIGS. 11 and 12, the same reference numerals refer to the same elements as the first exemplary embodiment shown in FIGS. 1 to 8 and a detailed description thereof is omitted.

As shown in FIG. 11, in the upper part of drain cup 42, a first inclination portion $42a_1$ of which a height level slowly decreases up to a middle portion 42e toward an outer periphery 42d from an inner periphery 42c and a second inclination portion $42a_2$ of which a height level slowly increases up to outer periphery 42d from middle portion 42e are formed. Concave portion 42a is constituted by first inclination portion $42a_1$ and second inclination portion $42a_2$. In drain cup 42 shown in FIG. 11, the height level of inner periphery 42c is higher than that of outer periphery 42d.

Nozzle supporting arm 82 is placed in the upper part of drain cup 42 to be able to advance and retreat and the deionized water (cleaning liquid) is supplied from the upper part to concave portion 42a in the upper part of drain cup 42 from nozzle 82a attached to the front end of nozzle supporting arm 82.

As nozzle supporting arm 82 supplying the deionized water to concave portion 42a of drain cup 42, any one of six nozzle supporting arms 82 shown in FIG. 2 is used. The cleaning liquid is supplied into concave portion 42a of drain cup 42 from nozzle 82a installed at the front end of nozzle supporting arm 82 and the cleaning liquid is supplied to concave portion 42a to be stored in concave portion 42a. Therefore, drain cup 42 is cleaned by the cleaning liquid supplied to concave portion 42a in the upper part of drain cup 42 from nozzle 82a of nozzle supporting arm 82. In the exemplary embodiment, a drain cup cleaning unit for cleaning drain cup 42 is constituted by nozzle supporting arm 82 having nozzle 82a. Drain cup 42 may be cleaned by the drain cup cleaning unit for each processing of wafer W or may be cleaned periodically (for example, the cleaning cycle such as once a day or once a month may be arbitrarily set).

A cleaning liquid discharging pipe 49e is installed in middle portion 42e of concave portion 42a of drain cup 42, an opening/closing valve 49f is installed in cleaning liquid discharging pipe 49e, and a drain line 49g is joined to opening/closing valve 49f. Concave portion 42a of drain cup 42 and drain line 49g are in communication with each other by opening/closing valve 49f to discharge the cleaning liquid that remains in concave portion 42a to a drain portion 49i by drain line 49g.

Herein, in drain cup 42 shown in FIG. 11, since the height level of inner periphery 42c is higher than that of outer periphery 42d, the cleaning liquid supplied to concave portion 42a in the upper part of drain cup 42 by nozzle 82a of nozzle supporting arm 82 is discharged to the outside (the left side in FIG. 11) from outer periphery 42d in the upper part of drain cup 42. The cleaning liquid discharged from outer periphery 42d in the upper part of drain cup 42 is sent to storage part 52a of cleaning unit 52 and stored in storage part 52a. Thereafter, the cleaning liquid in storage part 52a is discharged to the outside of the apparatus by drain pipe 52c installed on the side of storage part 52a.

However, as described above, rotational cup 40 rotating together with holding unit 21 holding wafer W is installed at the inside of drain cup 42.

An outer periphery of rotational cup 40 is positioned slightly above inner periphery 42c of drain cup 42 and a cylindrical protrusion 40a that protrudes to the outside and extends cylindrically is installed on the outer periphery of rotational cup 40.

Cylindrical protrusion 40a generates rotating air current on the outer periphery of rotational cup 40 with the rotation of rotational cup 40. The rotating air current generated by the rotation of rotational cup 40 is sent to drain cup 42 to serve to agitate the cleaning liquid supplied to concave portion 42a of drain cup 42 as described below and to diffuse the cleaning liquid widely across the entire circumference of concave portion 42a.

Drain cup 42 installed in liquid processing apparatus 10 of the exemplary embodiment is not limited to the configuration shown in FIG. 11. Drain cup 42 in which the height level of inner periphery 42c is lower than that of outer periphery 42d may be used as shown in FIG. 12. In this case, the cleaning liquid supplied to concave portion 42a in the upper part of drain cup 42 by nozzle 82a of nozzle supporting arm 82 is discharged to the inner side (to the right side in FIG. 12) from inner periphery 42c in the upper part of drain cup 42. In this case, inner peripheral surface 42f of drain cup 42 or rotational cup 40 can be cleaned by the cleaning liquid supplied to concave portion 42a in the upper part of drain cup 42 by nozzle 82a of nozzle supporting arm 82.

As drain cup 42, a drain cup in which the height level of inner periphery 42c is substantially equal to that of outer periphery 42d may be used. In this case, the cleaning liquid supplied to concave portion 42a in the upper part of drain cup 42 is discharged from both inner periphery 42c and outer periphery 42d in the upper part of drain cup 42.

Next, a cleaning process of drain cup 42 will be described with reference to FIGS. 11 and 12.

In FIGS. 11 and 12, a series of liquid processing processes of wafer W are completed and wafer W is transferred to the outside of liquid processing apparatus 10 by a transfer arm 104 and thereafter, the cleaning process of drain cup 42 is executed.

The example in which the cleaning liquid is supplied to the upper part of drain cup 42 from nozzle 82a is described, but the present disclosure is not limited thereto and the cleaning liquid may be supplied to the upper part of drain cup 42 from nozzle 82a and the cleaning liquid may be supplied to the lower part of drain cup 42 from cleaning water supplying unit 49. A rotational direction of rotational cup 40 is changed for every predetermined time to effectively clean drain cup 42 and effectively clean even inner peripheral surface 42f of drain cup 42 and rotational cup 40.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
a processing chamber in which a substrate holding unit configured to hold a substrate and a cup placed around the substrate holding unit are installed;
a guide cup provided at a lower side of the cup including a processing liquid recovering tank attached at a bottom portion thereof such that a processing liquid laterally scattered from the substrate is guided by the guide cup to be collected at the processing liquid recovering tank;
a nozzle configured to supply a processing liquid to the substrate held by the substrate holding unit; and
a cup cleaning unit configured to clean the cup by supplying a cleaning liquid to an upper part of the cup,
wherein a concave portion is formed along an outside surface of the upper part of the cup located above the guide cup such that the concave portion of the cup is disposed entirely above the guide cup and the processing liquid recovering tank, and the cup cleaning unit supplies the cleaning liquid to the concave portion in the upper part of the cup.

2. The liquid processing apparatus of claim 1, wherein in the upper part of the cup, a height level decreases up to a middle portion toward an outer periphery from an inner periphery and the height level increases up to the outer periphery from the middle portion, and
the cup cleaning unit supplies the cleaning liquid to the middle portion in the upper part of the cup.

3. The liquid processing apparatus of claim 1, wherein since the height level of the inner periphery of the upper part of the cup is higher than that of the outer periphery thereof, the cleaning liquid supplied to the concave portion in the upper part of the cup by the cup cleaning unit is discharged from the outer periphery of the upper part of the cup.

4. The liquid processing apparatus of claim 1, wherein since the height level of the inner periphery of the upper part of the cup is lower than that of the outer periphery thereof, the cleaning liquid supplied to the concave portion in the upper part of the cup by the cup cleaning unit is discharged from the inner periphery of the upper part of the cup.

5. The liquid processing apparatus of claim 1, wherein a plurality of cups is installed to be overlapped with each other in a vertical direction, and the cup cleaning unit cleans an uppermost cup among the plurality of cups along the vertical direction.

6. The liquid processing apparatus of claim 1, wherein a rotational cup rotating together with the substrate holding unit holding the substrate is installed at inside of the cup and the cleaning liquid is widely diffused across the entire area of the concave portion in the upper part of the cup by rotating air current generated with the rotation of the rotational cup.

7. The liquid processing apparatus of claim 1, wherein the cup cleaning unit has a cleaning liquid supplying nozzle supplying the cleaning liquid to the concave portion in the upper part of the cup from upward.

8. The liquid processing apparatus of claim 6, wherein a cylindrical protrusion that protrudes to the outside and extends cylindrically is installed on the outer periphery of the rotational cup and the rotating air current is generated by the cylindrical protrusion of the rotational cup.

* * * * *

UNITED STATES PATENT AND TRADEMARK OFFICE
CERTIFICATE OF CORRECTION

PATENT NO. : 8,944,081 B2  Page 1 of 1
APPLICATION NO. : 13/356236
DATED : February 3, 2015
INVENTOR(S) : Higashijima et al.

It is certified that error appears in the above-identified patent and that said Letters Patent is hereby corrected as shown below:

Title Page, Item (12) delete "Higashijima" and insert --Higashijima et al.--.

Title Page, Item (75) Inventor, should read

--(75) Inventors: Jiro Higashijima, Koshi (JP); Koji Kagawa, Koshi (JP); Shogo Mizota, Koshi (JP)--.

Signed and Sealed this
Eighth Day of March, 2016

Michelle K. Lee
*Director of the United States Patent and Trademark Office*